(12) United States Patent
Narita et al.

(10) Patent No.: US 6,274,507 B1
(45) Date of Patent: Aug. 14, 2001

(54) PLASMA PROCESSING APPARATUS AND METHOD

(75) Inventors: Masaki Narita; Yukimasa Yoshida; Kei Hattori; Katsuya Okumura, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/226,723

(22) Filed: Jan. 7, 1999

(30) Foreign Application Priority Data

Jan. 9, 1998 (JP) .................................. 10-014926

(51) Int. Cl.⁷ ......................... H01L 21/31; H01L 21/469
(52) U.S. Cl. ......................... 438/758; 438/763; 438/907; 438/908; 438/909
(58) Field of Search ..................... 438/758, 763, 438/907, 908, 909

(56) References Cited

U.S. PATENT DOCUMENTS

| | | | |
|---|---|---|---|
| 5,387,545 | * | 2/1995 | Kiyota et al. .................... 437/165 |
| 5,427,055 | * | 6/1995 | Ichikawa ........................ 117/92 |
| 5,611,655 | * | 3/1997 | Fukasawa et al. ............... 414/217 |
| 5,788,825 | * | 8/1998 | Park et al. ................... 204/298.07 |
| 5,873,942 | * | 10/2000 | Park et al. ..................... 118/719 |
| 6,037,272 | * | 3/2000 | Park et al. ..................... 438/758 |
| 6,089,184 | * | 7/2000 | Kaizuka et al. .............. 118/723 VE |
| 6,126,753 | * | 10/2000 | Shinriki et al. ................. 118/715 |

* cited by examiner

Primary Examiner—John F. Niebling
Assistant Examiner—Walter L. Lindsay, Jr.
(74) Attorney, Agent, or Firm—Finnegan, Henderson, Farabow, Garrett & Dunner, L.L.P.

(57) ABSTRACT

A semiconductor processing apparatus includes a load chamber, an unload chamber, a common transfer chamber, a first process chamber, and a second process chamber, which are connected via gate valves. The load and unload chambers are connected to a first vacuum-exhaust mechanism including a common dry pump. The common transfer chamber is connected to a second vacuum-exhaust mechanism including a dry pump. The first and second processes chambers are connected to a third vacuum-exhaust mechanism including a common dry pump, and first and second turbo molecular pumps. The processing apparatus includes a controller which can drive and stop the dry pumps independently of each other in coordination with open/closed switching of the gate valves, while keeping the turbo molecular pumps driven.

18 Claims, 3 Drawing Sheets

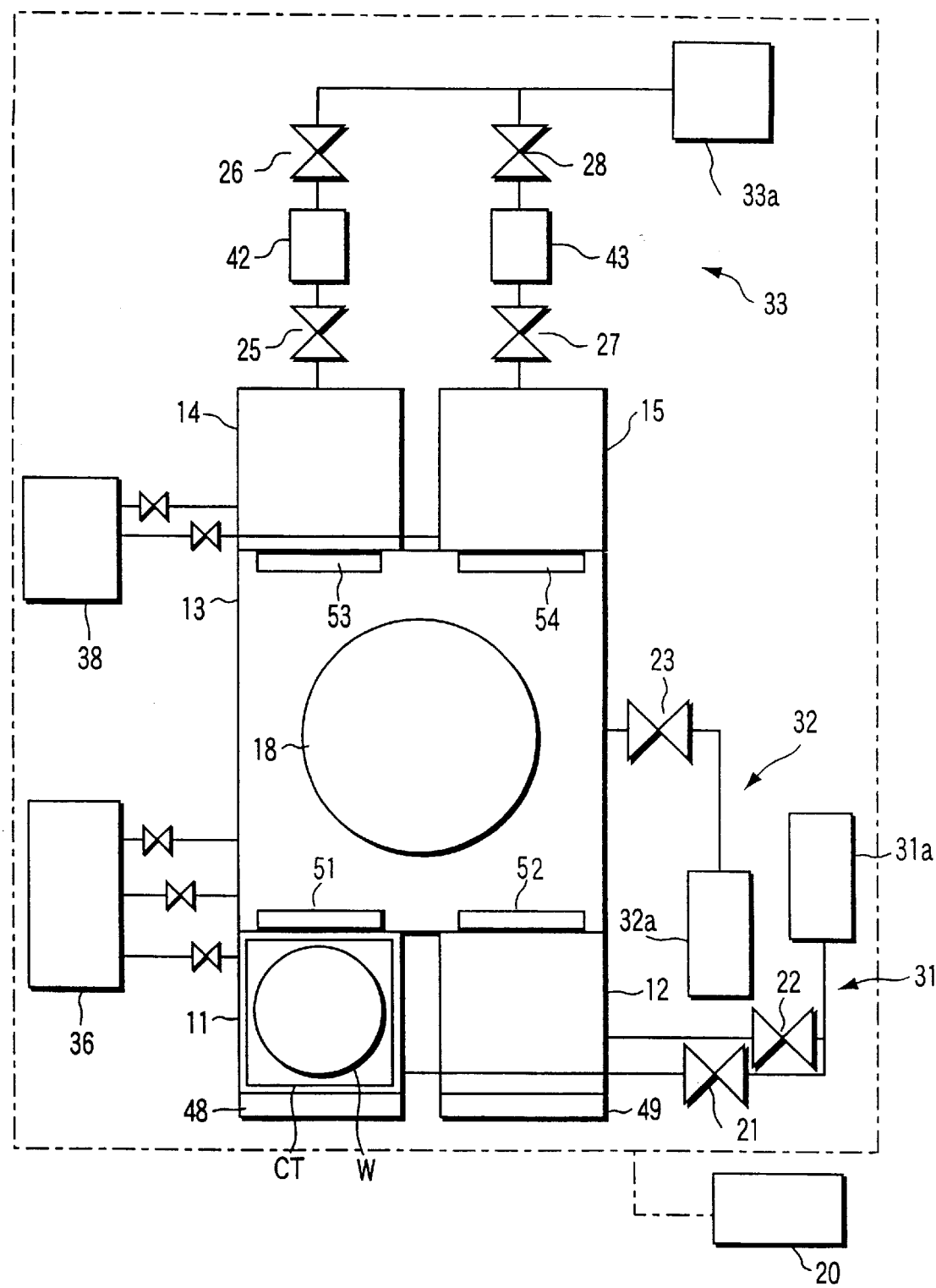
F I G. 1

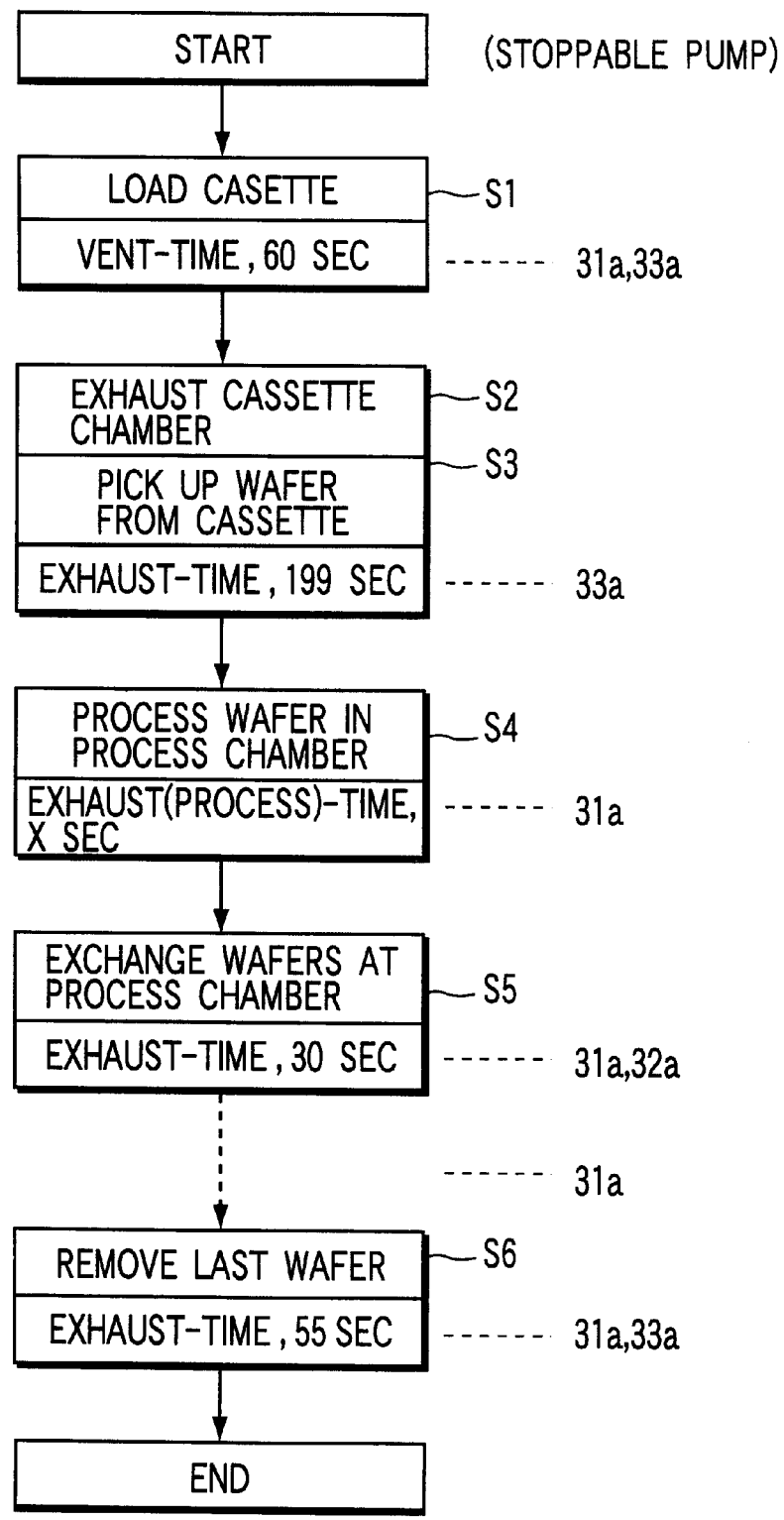
F I G. 2

PLASMA PROCESSING APPARATUS AND METHOD

BACKGROUND OF THE INVENTION

The present invention relates to an apparatus and method for subjecting a work-piece substrate to a semiconductor process. The term "semiconductor process" used herein includes various kinds of processes which are performed to manufacture a semiconductor device or a structure having wiring layers, electrodes, and the like to be connected to a semiconductor device, on a work-piece substrate, such as a semiconductor wafer or an LCD substrate, by forming semiconductor layers, insulating layers, and conductive layers in predetermined patterns on the substrate.

Among the processes of manufacturing semiconductor devices which have been highly integrated in recent years, processes using a vacuum-processing apparatus (semiconductor processing apparatus) are currently in the main. For example, in a process of forming a gate wiring layer, a poly-crystalline silicon film is formed as a material of the gate wiring layer by a CVD (Chemical Vapor Deposition) method. Then, a predetermined mask pattern made of a photoresist layer is formed on the silicon film by a lithography method. Then, unnecessary parts of the poly-crystalline silicon film for forming the wiring layer are removed by an anisotropic etching method, such as an RIE (Reactive Ion Etching) method, so that the wiring layer is completed. After the wiring layer is formed, the photoresist layer, which has become unnecessary is removed. In this process, when the poly-crystalline silicon film is formed, when the poly-crystalline silicon film is patterned, and when the photoresist layer is removed after the wiring layer is formed, a CVD apparatus, a dry-etching apparatus, and a dry-ashing apparatus are used, respectively.

Further, in a process of forming an aluminum (Al) wiring layer, which is currently used in general, several vacuum-processing apparatuses are used. Specifically, when an aluminum film is formed, a sputtering apparatus is used. When the aluminum film is patterned with a predetermined mask pattern, a dry-etching apparatus is used. When a used photoresist is removed after the wiring layer is formed, a dry-ashing apparatus is used.

As described above, in order to form the wiring structure of a semiconductor device, at least several tens of processes using vacuum-processing apparatuses are necessary. Besides, a dry-etching technique using plasma is indispensable especially in micro-lithography.

Further, in order to form other device structures in the semiconductor device, several kinds of vacuum-processing apparatuses, such as a film formation apparatus and an RIE apparatus, are also necessary. For example, an RIE apparatus for an oxide film basically has a structure shown in FIG. 5. The vacuum-processing apparatus shown in FIG. 5 includes two vacuum-process chambers. The vacuum-processing apparatus is constituted of load and unload chambers (which may be referred to as cassette chambers), a common transfer chamber (which may be referred to as a transfer robot chamber), and the vacuum-process chambers (which may be referred to as process chambers). When a semiconductor wafer is transferred into a process chamber, the cassette chambers 61 and 62 are set at a pressure-reduced state in advance, so that the wafer is transferred while the pressure of the process chamber is kept at a pressure-reduced state. The common transfer chamber 63 is used for distributing wafers from the cassette chambers 61 and 62 to the process chambers. The process chambers 64 and 65 are used each for subjecting a wafer to a predetermined semiconductor process.

In recent years, it is usual to arrange a plurality of process chambers as shown in FIG. 5, so that the productivity is improved. In other words, FIG. 5 is a standardized block diagram showing a dry-etching apparatus currently used. In this vacuum-processing apparatus, the cassette chambers 61 and 62 are connected to a common dry pump 68, so that they can function as vacuum chambers. Similarly, the common transfer chamber 63 is connected to a dry pump 70. The process chambers 64 and 65 are connected to turbo molecular pumps 66 and 67, respectively, and to a common dry pump 71 through the turbo molecular pumps 66 and 67.

Generally, the cassette chambers and the common transfer chamber do not require any high vacuum, and thus only the dry pumps are used for exhausting these chambers. On the other hand, the process chambers require a high vacuum, and thus the turbo molecular pumps and the dry pump are used for them. Namely, the three dry pumps and the two turbo molecular pumps are used for the vacuum chambers of the semiconductor processing apparatus shown in FIG. 5. These pumps are continuously driven from the time when a wafer cassette is loaded, through a period of time for processing all the wafers, to the time when the wafer cassette is unloaded.

Dry-pumps require a lot of electric power for their operation. In recent semiconductor mass-production factories, manufacturing processes using vacuum-processing apparatuses as described above are performed as the main processes, and thus the number of apparatuses is large. Each of the vacuum processing apparatuses has a plurality of vacuum-exhaust mechanisms, so the total number of the vacuum-exhaust mechanisms in the factory is very large, and their running costs are enormous. To reiterate, in semiconductor processing installations, especially in mass-production installations, the running cost of dry pumps is enormous, and thus brings about a rise in the manufacturing cost.

Furthermore, in recent years, the greenhouse effect on the earth has become a serious international problem. In order to solve this problem, it is important to prevent, as far as possible, carbon oxide gases which are the main cause of the greenhouse effect from being produced. One of the main causes for production of carbon oxide gases is due to mass consumption of electric power. Therefore, it is necessary for the industrial field to suppress electric power consumption as far as possible. This is the same for semiconductor processes. In this respect, the above described increase in the manufacturing cost can be reduced, thereby contributing to solving the environmental problem.

BRIEF SUMMARY OF THE INVENTION

An object of the present invention is to lower the running cost of a semiconductor processing apparatus, which includes a plurality of vacuum chambers and vacuum-exhaust mechanisms, by reducing the amount of electric power to be used for the vacuum-exhaust mechanisms, and particularly for dry pumps.

According to a first aspect of the present invention, there is provided a semiconductor processing method comprising the steps of:

preparing a semiconductor processing apparatus including a plurality of vacuum chambers each capable of accommodating a work-piece substrate, and vacuum-exhaust mechanisms connected to the vacuum chambers, respectively, the vacuum chambers including a common transfer chamber for distributing the substrate, and a plurality of vacuum process chambers connected to the common transfer chamber, for processing the substrate;

loading the substrate into the apparatus, and transferring the substrate into at least one of the vacuum process chambers through the common transfer chamber;

subjecting the substrate to a semiconductor process in the at least one of the vacuum process chambers; and transferring the substrate thus processed from the at least one of the vacuum process chambers, and unloading the substrate out of the apparatus through the common transfer chamber, wherein the vacuum-exhaust mechanisms are selectively stopped for some of the vacuum chambers connected thereto which do not have to be continuously vacuum-exhausted, during a period of time from a time when the substrate is loaded into the apparatus, to a time when the substrate is unloaded from the apparatus.

According to a second aspect of the present invention, there is provided a semiconductor processing apparatus comprising:

a plurality of vacuum chambers each capable of accommodating a work-piece substrate, the vacuum chambers including a load and unload chamber unit for loading and unloading the substrate from and to an outside of the apparatus, a common transfer chamber connected to the load and unload chamber unit, for distributing the substrate, and a plurality of process chambers connected to the common transfer chamber, for semiconductor-processing the substrate;

vacuum-exhaust mechanisms connected to the vacuum chambers, respectively; and means for selectively stopping the vacuum-exhaust mechanisms for some of the vacuum chambers connected thereto which do not have to be continuously vacuum-exhausted, during a period of time from a time when the substrate is loaded into the apparatus, to a time when the substrate is unloaded from the apparatus.

According to a third aspect of the present invention, there is provided a semiconductor processing apparatus comprising:

a load and unload chamber unit for loading and unloading a cassette, which contains a plurality of work-piece substrates, from and to an outside of the apparatus means for supplying a pressure adjustment gas into the load and unload chamber unit;

a first vacuum-exhaust mechanism including a dry pump, for exhausting and setting the load and unload chamber unit at a vacuum;

a common transfer chamber connected to the load and unload chamber unit via a first gate valve, for distributing the substrates;

means for supplying the pressure adjustment gas into the common transfer chamber;

a second vacuum-exhaust mechanism including a dry pump, for exhausting and setting the common transfer chamber at a vacuum;

first and second process chambers connected to the common transfer chamber via second and third gate valves, respectively, for semiconductor-processing the substrates;

means for supplying a process gas into each of the first and second process chambers;

a third vacuum-exhaust mechanism including a dry pump, for exhausting and setting the first and second process chambers at a vacuum, the third vacuum-exhaust mechanism further including two turbo molecular pumps connected to the first and second process chambers, respectively;

a transfer unit arranged in the common transfer chamber, for transferring the substrates among the load and unload chamber unit and the first and second process chambers; and a controller for driving and stopping the dry pumps independently of each other in coordination with open/closed switching of the gate valves, while keeping the turbo molecular pumps driven.

BRIEF DESCRIPTION OF THE SEVERAL VIEWS OF THE DRAWING

FIG. 1 is a block diagram showing a semiconductor processing apparatus according to an embodiment of the present invention.

FIG. 2 is a chart showing part of a process sequence controlled by a controller in the apparatus shown in FIG. 1.

DETAILED DESCRIPTION OF THE INVENTION

Figure 3:
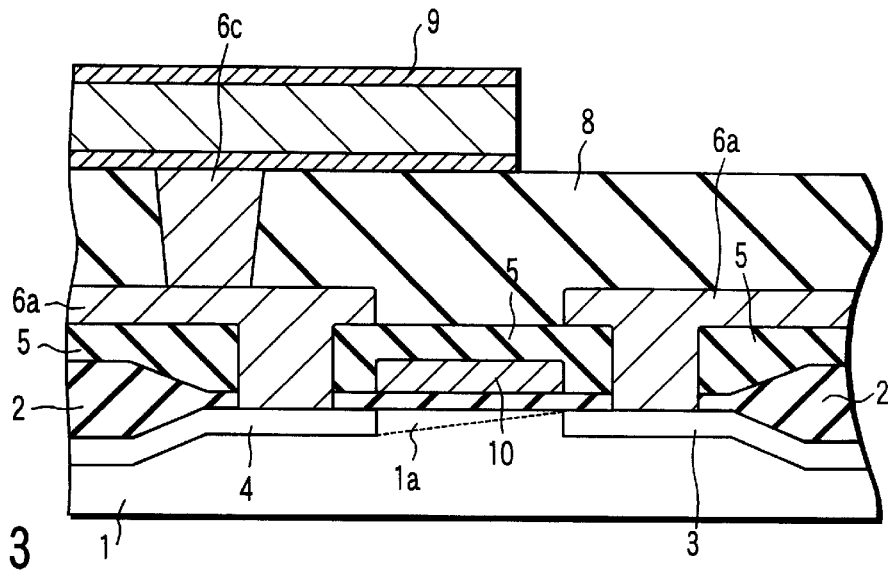
FIG. 3 is a cross-sectional view showing a semiconductor device formed by an application of the present invention.

In a process of developing the present invention, the present inventors conducted various kinds of experiments on the exhaust systems of semiconductor processing apparatuses each having a plurality of vacuum chambers and vacuum-exhaust mechanisms. Upon these experiments, the present inventors have obtained the following findings.

Specifically, a dry etching apparatus representing semiconductor processing apparatuses is constituted, for example, by two etching chambers, one common transfer chamber, and two cassette chambers in general. The structure of an apparatus varies depending on the type of the apparatus, such that, for example, an apparatus for dry-etching a metal wiring layer is further provided with a resist-ashing chamber in addition to the above described constitution, in some cases.

A cassette for semiconductor wafers is placed in one of the cassette chambers, which is then exhausted by a vacuum-exhaust mechanism, such as a dry pump, connected thereto, so that the cassette chamber is pre-exhausted before the wafers are transferred by a transfer robot. At this time, the common transfer chamber is also being exhausted by a vacuum-exhaust mechanism, such as a dry pump, connected thereto, since the common transfer chamber has to be kept in a pressure-reduced state.

When the cassette chamber is exhausted down to a predetermined pressure or less, a valve arranged between the cassette chamber and the common transfer chamber is set open, so that the wafers start being transferred. After this time, since the valve is kept open, both the chambers do not have to be exhausted separately by the respective vacuum-exhaust mechanisms.

There is a period of time of from several tens of seconds to several minutes, until a wafer is actually placed in one of the process chambers after the wafers are placed in the cassette chamber and the wafers start being transferred.

During this period of time, the process chambers do not have to be kept vacuum-exhausted.

Where there are no wafers to be processed, it suffices that the process chambers are kept at a reduced pressure enough to soon start a process. In other words, the process chambers do not have to be continuously vacuum-exhausted in this case. Turbo molecular pumps used in the apparatus have to be continuously driven, because they require a long period of time to restart after being stopped. However, where there are no wafers to be processed, valves between the turbo molecular pumps and the process chambers, and valves between the turbo molecular pumps and the dry pump are allowed to be closed, so that the turbo molecular pumps are isolated. Even in this state, the turbo molecular pumps are stably driven for from several minutes to several tens of minutes, while the corresponding dry pump can be stopped for this period of time. In this case, the back pressure sides of the turbo molecular pumps need to be drawn by the dry pump before the back pressures of the turbo molecular pumps become too high (about once every ten minutes).

As described above, in this kind of semiconductor processing apparatuses, pumps for exhausting vacuum chambers, which are not necessarily continuously vacuum-exhausted, and especially dry pumps, are allowed to be selectively stopped, depending on the open/closed states of gate valves among the vacuum chambers. Where the exhaust pumps are selectively driven and stopped, the amount of electric power consumption is decreased, thereby lowering the running cost.

An explanation will be given, with reference to the drawings, to embodiments of the present invention, which was made on the basis of the above described findings.

FIG. 1 is a block diagram showing a semiconductor processing apparatus according to an embodiment of the present invention, which is used for etching a silicon oxide film on a semiconductor wafer. The pumps used in this semiconductor processing apparatus include, e.g., dry pumps and turbo molecular pumps.

A dry pump is a vacuum-pump having, e.g., a claw-shaped rotor. The claw-shaped rotor has a self-valve function in its exhaust mechanism, and thus has a very high pressurizing efficiency, when used for a pump. Accordingly, the rotor can be used for continuous exhaustion, in a pressure range of from atmospheric pressure to a high pressure. Further, the rotor is of the non-contact type used at a low speed of revolution, and thus bears little mechanical abrasion, thereby presenting a long service life. The pump with this rotor allows the exhaust pressure to reach $3 \times 10^{-3}$ Torr with an electric power of 7.5 kW.

A turbo molecular pump is a vacuum pump, which can present a higher vacuum degree. This pump allows the exhaust pressure to reach a pressure on the order of $10^{-6}$ mbar, and further on the order of $10^{-8}$ mbar, with an electric power consumption of 15W to 25W. Where a turbo molecular pump is used for a vacuum process chamber, it is advantageous for the pump to be continuously driven, as compared to a manner in which the pump is operated to obtain a vacuum state only when a process is actually performed.

The processes, which can be performed in the vacuum process chambers according to the present invention, include dry etching, CVD, sputtering, vacuum evaporation, resist film removal (ashing), and heat-treatment. The dry etching is a method of etching a film without any solution, but with ions or plasma, and includes sputtering etching and ion etching. The CVD is a method of depositing a thin film, using a chemical reaction of gases, and includes atmospheric or vacuum CVD, and plasma CVD. The CVD is used for forming an oxide film or a metal wiring layer. The sputtering is a method of causing positive ions in plasma to be accelerated and collided with a target, and depositing flying substances thus discharged therefrom on a wafer. The sputtering is used for forming a metal wiring layer. The vacuum evaporation is a method of evaporating a substance for forming a thin film by heat, and depositing it on a wafer. The vacuum evaporation is used for forming an aluminum wiring layer. The ashing is a method of removing a photoresist in vapor phase.

The apparatus shown in FIG. 1 is used for dry-etching an oxide film, which occupies the largest number of steps in a process of manufacturing a semiconductor device.

This semiconductor processing apparatus includes vacuum chambers each for loading or unloading a cassette CT, which is used for containing a plurality of semiconductor wafers W; i.e., a loading chamber 11 and an unloading chamber 12 (cassette chambers). The cassette chambers 11 and 12 are provided with gate valves 48 and 49, respectively, on their side walls, for allowing them to communicate with the outside of the apparatus. The cassette chambers 11 and 12 are connected to an inactive gas supply mechanism 36 for supplying a pressure adjustment gas consisting of an inactive gas, such as nitrogen or argon. The cassette chambers 11 and 12 are also connected to a vacuum-exhaust mechanism 31 including a common dry pump 31a, for exhausting the cassette chambers 11 and 12, and setting them at a vacuum. The dry pump 31a is connected to the cassette chamber 11 and 12 through valves 21 and 22, respectively. The dry pump 31a has an exhaust capacity of 7000 L(liters)/min, so that the cassette chambers 11 and 12 can be exhausted at a high rate.

The cassette chambers 11 and 12 are connected to a vacuum chamber for distributing the wafers W, i.e., a common transfer chamber 13, through gate valves 51 and 52, respectively. The common transfer chamber 13 is connected to the inactive gas supply mechanism 36 for supplying a pressure adjustment gas consisting of an inactive gas, such as nitrogen or argon. The common transfer chamber 13 is also connected to a vacuum-exhaust mechanism 32 including a dry pump 32a, for exhausting the common transfer chamber 13, and setting it at a vacuum. The dry pump 32a is connected to the common transfer chamber 13 through a valve 23.

The common transfer chamber 13 is connected to vacuum chambers for subjecting the wafers W to semiconductor processes, i.e., first and second process chambers 14 and 15 (vacuum process chambers), through gate valves 53 and 54, respectively. The first and second process chambers 14 and 15 are connected to a process gas supply mechanism 38 for supplying a process gas consisting of a reactive gas for etching a silicon oxide film. The first and second process chambers 14 and 15 are also connected to a vacuum-exhaust mechanism 33 including a common dry pump 33a, for exhausting the first and second process chambers 14 and 15, and setting them at a vacuum. The vacuum-exhaust mechanism 33 further includes two turbo molecular pumps 42 and 43 connected to the first and second process chambers 14 and 15, respectively. The first process chamber 14 is connected to the dry pump 33a through a valve 25, the turbo molecular pump 42, and a valve 26. The second process chamber 15 is connected to the dry pump 33a through a valve 27, the turbo molecular pump 43, and a valve 28.

A transfer unit 18 is arranged in the common transfer chamber 13, for transferring the wafers W. The transfer unit 18 is used for transferring the wafers from and into cassettes CT placed in the cassette chambers 11 and 12. The transfer unit 18 is also used for transferring the wafers from and into the first and second process chambers 14 and 15. In other words, the transfer unit 18 is used for transferring the wafers among the cassette chambers 11 and 12 and the first and second process chambers 14 and 15.

The transfer unit 18, the vacuum-exhaust mechanisms 31, 32, and 33, the gas supply mechanisms 36 and 38, and the gate valves 48 to 54 are operated under the control of a predetermined program stored in a controller 20 in advance. The gist of the present invention resides in that the controller 10 allows the dry pumps 31a, 32a, and 33a to be independently driven or stopped, in coordination with the open/closed switching of the gate valves 48 to 54, while keeping the turbo molecular pumps 42 and 43 driven.

When the semiconductor processing apparatus according to the present invention is in a waiting state, i.e., no wafers are being processed, the first and second process chambers 14 and 15 are continuously exhausted by the turbo molecular pumps 42 and 43, and the dry pumps 33a. During this period of time, the common transfer chamber 13 is continuously exhausted by the dry pump 32a. The gate valves 48 to 54 are set closed, so that the respective chambers are isolated from each other.

When the wafers start being processed, at first, the valve 21 is set closed, the cassette chamber 11 is brought back to atmospheric pressure, and a cassette CT is placed in the cassette chamber 11. Then, the valve 21 is set open, and the cassette chamber 11 is exhausted. After the pressure in the cassette chamber 11 is reduced to a predetermined pressure, the gate valve 51 is set open, and a wafer W is drawn out of the cassette CT by the transfer robot, i.e., transfer unit 18. After the transfer unit 18 receives the wafer W, the gate valve 51 is set closed. Then, the gate valve 53 is set open, and the wafer W is transferred into the process chamber 14. Then, the gate valve 53 is set closed, and the wafer W is subjected to a plasma process.

An explanation will be given to the operation of the vacuum-exhaust mechanisms 31, 32, and 33, with reference to FIGS. 1 and 2. FIG. 2 is a chart showing part of a process sequence controlled by the controller 20.

As described above, first in a step S1, prior to the cassette CT being loaded into the cassette chamber 11, the valve 21 is set closed, and the cassette chamber 11 is supplied with the pressure adjustment gas, so that it is brought back to atmospheric pressure. The vent period of time for bringing the cassette chamber 11 back to atmospheric pressure is, e.g., about 60 minutes. During this period of time, the gate valves 48 and 51 are set closed, and, entirely or partly over this period of time, the dry pump 32a is driven, and the dry pumps 31a and 33a are stopped. After the cassette chamber 11 is brought back to atmospheric pressure, the gate valve 48 is set open, and the cassette CT is placed in the cassette chamber 11. It is assumed here that the cassette chamber 12 is in an unused state with the gate valves 49 and 52 being closed, and the valve 22 being closed, for the sake of easy understanding.

Then in a step S2, immediately after the cassette CT is placed in the cassette chamber 11, the gate valve 48 is set closed, the valve 21 is set open, and the cassette chamber 11 starts being exhausted. During this period of time, the gate valve 51 remains closed, and, entirely or partly over this period of time, the dry pumps 31a and 32a are driven, and the dry pump 33a is stopped. After the cassette chamber 11 reaches a predetermined vacuum pressure, the gate valve 51 is set open.

Then in a step S3, a wafer W1 is transferred from the cassette chamber 11 into the common transfer chamber 13 by the transfer unit 18. After the gate valve 51 is set open, the cassette chamber 11 is exhausted by the dry pump 32a of the common transfer chamber 13. Accordingly, the dry pump 31a of the cassette chamber 11 is stopped. Note that the total exhaust period of time of the steps S2 and S3, i.e., the sum of a period of time, for which the cassette chamber 11 is vacuum-exhausted, and a period of time, for which the wafer W1 is present in the common transfer chamber 13, is about 199 seconds, for example.

Then in a step S4, the gate valve 51 is set closed, the gate valve 53 is set open, and the wafer W1 is placed in the process chamber 14 by the transfer unit 18. Entirely or partly over this period of time, the dry pump 33a is driven, and the dry pumps 31a and 32a are stopped. Then, the gate valve 53 is set closed, and the wafer W1 is subjected to a semiconductor process. During this period of time, the gate valve 51 remains closed, and, entirely or partly over this period of time, the dry pumps 32a and 33a are driven, and the dry pump 31a is stopped. The semiconductor process is ended when the wafer W1 is processed in the process chamber 14 for a predetermined period of time X. It is assumed here that the process chamber 15 is in an unused state with the gate valve 54 being closed, and the valves 27 and 28 being closed, for the sake of easy understanding.

Then in a step S5, the gate valve 53 is set open, and the processed wafer W1 is exchanged for a new wafer W2, relative to the process chamber 14. During this period of time, the gate valve 51 remains closed, and, entirely or partly over this period of time, the dry pump 33a is driven, and the dry pumps 31a and 32a are stopped. After the gate valve 53 is set open, the common transfer chamber 13 is exhausted and kept at a vacuum by the vacuum exhaust mechanism 33 of the process chamber 14, i.e., the turbo molecular pump 42 and the dry pump 33a, so that the dry pump 32a is stopped. The exhaust period of time of the step S5 is about 30 seconds, for example, and during this period of time, the dry pump 32a is stopped, e.g., for about 20 seconds. With the above described operations, a plurality of wafers are subjected to a predetermined semiconductor process.

Then in a step S6, when the last wafer Wn is being transferred from the process chamber 14 by the transfer unit 18 while the gate valve 53 is being opened and closed, the gate valve 51 is set closed, and, entirely or partly over this period of time, the dry pump 32a is driven, and the dry pumps 31a and 33a are stopped. The exhaust period of time of the step S6 is about 55 seconds, for example.

Based upon the sequence shown in FIG. 2, stopping ratios of the dry pumps, on the condition that two lots are processed at the same time, are calculated as follows.

Among the specific process periods of time for an oxide film (process core times in a process chamber), the shortest one is 34 seconds (X=34), and the longest one is 235 seconds (X=235). The entire process period of time for the two lots (process time) as a whole is 2,199 seconds in the case of the shortest one (X=34) of the process core times for an oxide film, and, on the other hand, it is 6,972 seconds in the case of the longest one. In either of the cases, where the process is performed in accordance with the steps shown in FIG. 2, the dry pumps are stopped in the following stopping ratios.

The dry pump 31a can be stopped other than the period of time (199 seconds) when the cassette chambers are exhausted thereby. Accordingly, in the case of the shortest one (X=34), the dry pump 31a can be stopped in a ratio of (2,199−199)/2,199=89%. In the case of the longest one (X=235), the dry pump 31a can be stopped in a ratio of (6,972−199)/6,972=97%.

The dry pump 32a can be stopped when the 24 wafers of the two lots are exchanged, wherein a period of time of 20 seconds is necessary for each one of the wafers. Accordingly, in the case of the shortest one (X=34), the dry pump 32a can be stopped in a ratio of [20×24](=480 seconds)/2,199=22%. In the case of the longest one (X=235), the dry pump 32a can be stopped in a ratio of [20×24]/6,972=6.9%.

The dry pump 33a can be stopped for a period of time (60 seconds+199 seconds) before the sequential in-process-chamber processes start, and a period of time (55 seconds) after the sequential in-process-chamber processes end. Accordingly, in the case of the shortest one (X=34), the dry pump 33a can be stopped in a ratio of [60+199+55]/2,199= 14%. In the case of the longest one (X=235), the dry pump 33a can be stopped in a ratio of 314/6,972=4.5%.

Since the semiconductor processing apparatus in FIG. 1 includes two process chambers 13 and 14, it has an advantage that a process including sequential steps can be performed in a simplified manner. For example, the process chamber 14 may be used for etching while the process chamber 15 may be used for dry-ashing to remove a photoresist layer used in the etching. In this case, wafers are transferred from the process chamber 14 to the process chamber 15. The process chamber 14 may also be used as a sputtering unit while the process chamber 15 may be used as a CVD unit.

An explanation will be given as to how to apply the semiconductor processing apparatus to a process of manufacturing a semiconductor device.

FIG. 3 is a cross-sectional view showing a work-piece substrate on which a MOS transistor constituting a semiconductor device is arranged. A P-type silicon semiconductor (P-Si) is used as the work-piece substrate. In the surface of the substrate 1, N-type impurity diffusion layers 3 and 4 to be the source/drain regions of the transistor are formed to define a channel region between the source/drain regions.

In the surface of the substrate 1, there is also a silicon oxide film 2 formed by a heat-oxidation treatment. The silicon oxide film 2 is used as a field oxide film (device isolation region) and a gate oxide film. The silicon oxide film 2 may be formed in the semiconductor processing apparatus according to the present invention. The gate oxide film is arranged on a portion between the source/drain regions 4 and 3.

A poly-crystalline gate 10 is arranged on the gate oxide film. The poly-crystalline gate 10 may be formed by a CVD method in the semiconductor processing apparatus according to the present invention. A silicon oxide film ($SiO_2$) 5 is formed on the substrate 1 by a CVD method to cover the silicon oxide film 2 and a poly-crystalline gate 10. The $SiO_2$ film 5 may also be formed in the semiconductor processing apparatus according to the present invention.

Metal wiring layers 6a and 6b made of a first W film are arranged on the $SiO_2$ film 5. The metal wiring layers 6a and 6b may be formed by a CVD method in the semiconductor processing apparatus according to the present invention. The wiring layer 6a of the W (tungsten) film is electrically connected to the drain region 3 through a contact hole formed in the $SiO_2$ film 5 and the silicon oxide film 2. The wiring layer 6b of the W film is electrically connected to the source region 4 through a contact hole formed in the $SiO_2$ film 5 and the silicon oxide film 2.

A silicon oxide film ($SiO_2$) 8 is arranged on the substrate 1 to cover the wiring layers 6a and 6b, and the $SiO_2$ film 5.

The silicon oxide film 8 may be formed by a CVD method in the semiconductor processing apparatus according to the present invention. A second metal wiring layer 9 is arranged on the $SiO_2$ film 8. The metal wiring layer 9 may be formed by a sputtering method in the semiconductor processing apparatus according to the present invention. The metal wiring layer 9 is constituted of a multi-layer structure of Ti/TiN films or an Al film and Ti/TiN films. The metal wiring layer 9 is electrically connected to the metal wiring layer 6a by an interconnection layer 6c, which is made of a W film in a contact hole formed in the $SiO_2$ film 8. The interconnection electrode 6c may be formed by a CVD method in the semiconductor processing apparatus according to the present invention.

Figure 4:
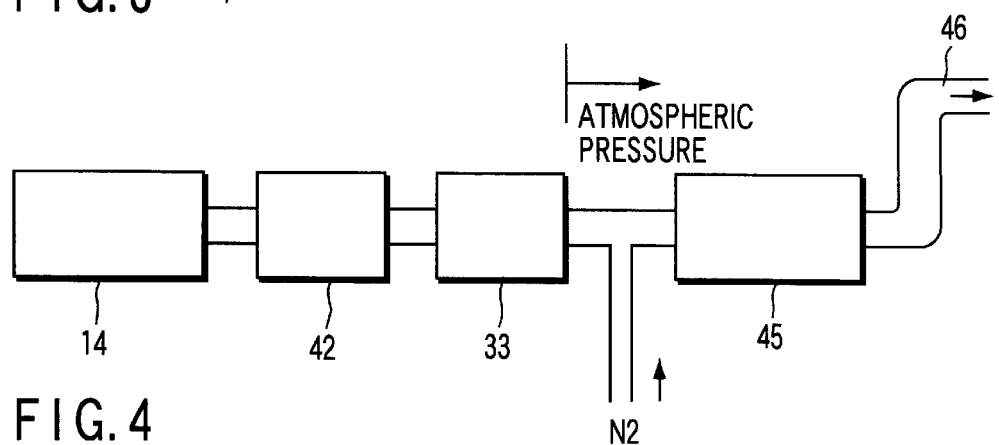
FIG. 4 is a block diagram showing a vacuum-exhaust mechanism used in the apparatus shown in FIG. 1.
Figure 5:
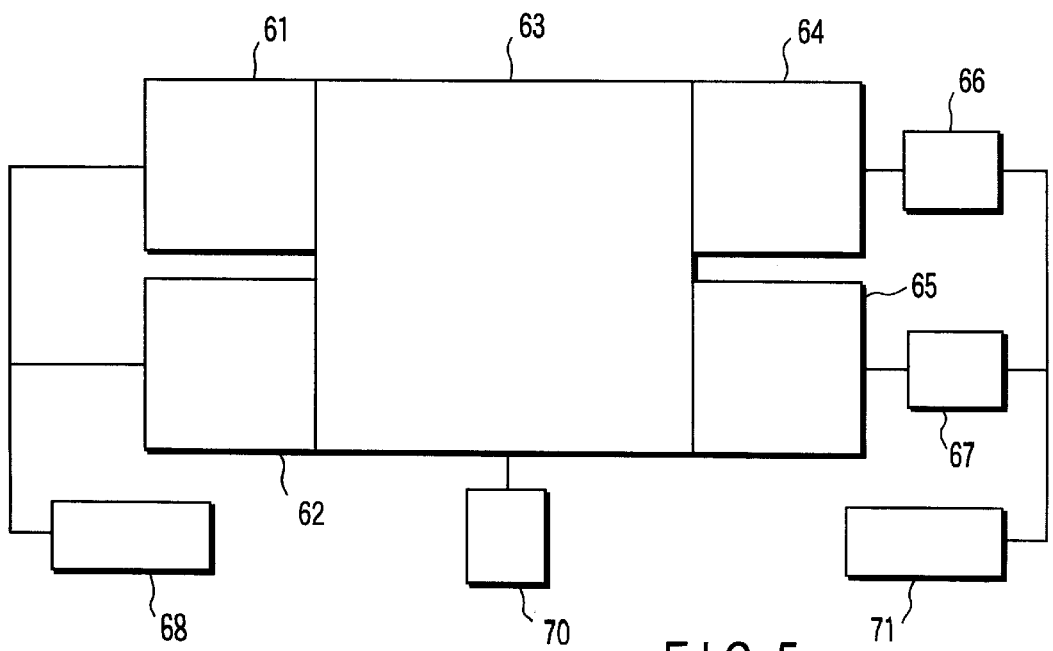
FIG. 5 is a block diagram showing a conventional semiconductor processing apparatus.

An explanation will be given to the exhaust mechanism of the semiconductor processing apparatus according to the present invention, with reference to FIG. 4. FIG. 4 is a block diagram showing the main elements of the exhaust mechanism used for the process chamber 14. The process chamber 14 is connected to the turbo molecular pump 42, which is in turn connected to the dry pump 33. Air exhausted by the dry pump 33 is discharged outside from a duct 46 through a detoxifying column 45. The air exhausted by the dry pump 33 is too concentrated at first, and is hard to detoxify. For this reason, the air to be exhausted is generally diluted with $N_2$ gas to a concentration at which it is easy to detoxify, before it is sent to the detoxifying column 45.

In the case of dry pump 33, the dilution is performed with $N_2$ gas at a flow rate of 10 liters per minute. When the dry pump is stopped, supply of the $N_2$ gas may also be stopped. Accordingly, in this semiconductor processing apparatus, the amount of electricity can be reduced by properly stopping supply of the $N_2$ gas, as well as the dry pump 33.

The present invention in its broader aspects is not limited to the specific details of the preferable embodiments which has been described with reference to the accompanying drawings. Various modifications, which should be deemed to belong to the present invention, may be made by those skilled in the art, without departing from the spirit or scope of the general inventive concept as defined by the appended claims and their equivalents.

What is claimed is:

1. A semiconductor processing method in a semiconductor processing apparatus, said apparatus comprising:

an I/O chamber section configured to load and unload a substrate cassette, which contains a plurality of work-piece substrates, from and to an outside of said apparatus;

a first system configured to supply a pressure adjustment gas into said I/O chamber section;

a first vacuum-exhaust mechanism, including a first dry pump, configured to exhaust and set said I/O chamber section at a vacuum;

a common transfer chamber connected to said I/O chamber section via a first gate valve, and configured to distribute the substrates;

a second system configured to supply a pressure adjustment gas into said common transfer chamber;

a second vacuum-exhaust mechanism, including a second dry pump, configured to exhaust and set said common transfer chamber at a vacuum;

a process chamber section connected to said common transfer chamber via a second gate valve, and configured to semiconductor-process the substrates;

a third system configured to supply a process gas into said process chamber section;

a third vacuum-exhaust mechanism, including a third dry pump, configured to exhaust and set said process chamber section at a vacuum, said third vacuum-exhaust mechanism further including a turbo-molecular pump connected to said process chamber section;

a transfer unit arranged in said common transfer chamber, and configured to transfer the substrates between said I/O chamber section and said process chamber section, and a controller configured to drive and stop said first, second, and third dry pumps independently of each other in coordination with open/closed switching of said gate valves, while keeping said turbo-molecular pump driven;

said method comprising the steps of:

loading a substrate into said apparatus, and transferring the substrate from said I/O chamber section into said process chamber section through said common transfer chamber, the substrate belonging to a substrate group contained in the substrate cassette which is loaded in said I/O chamber section;

subjecting the substrate to a semiconductor process in said process chamber section;

transferring the substrate from said process chamber section into said I/O chamber section through said common transfer chamber, and unloading the substrate out of said apparatus; and selectively stopping said first, second, and third dry pumps, under control of said controller, for any of said I/O chamber section, said common transfer chamber, and said process chamber section, which do not have to be continuously vacuum-exhausted, during a period of time from a time when the substrate is loaded into said apparatus, to a time when the substrate is unloaded from said apparatus.

2. The method according to claim 1, wherein said step of selectively stopping said first, second, and third dry pumps comprises opening a gate valve between the I/O chamber section and the common transfer chamber and using one of the first and second dry pumps to exhaust both the I/O chamber section and the common transfer chamber and stopping the other of the first and second dry pumps.

3. The method according to claim 1, wherein said step of selectively stopping said first, second, and third dry pumps is arranged such that there is a period of time for which said second dry pump is driven and said first and third dry pumps are stopped, while said first and second gate valves are set closed, before said substrate cassette is loaded into said I/O chamber section.

4. The method according to claim 1, wherein said step of selectively stopping said first, second, and third dry pumps is arranged such that there is a period of time for which said second and third dry pumps are stopped, while said first gate valve is set closed, and a pressure in said I/O chamber section is increased by said pressure adjustment gas.

5. The method according to claim 1, wherein said step of selectively stopping said first, second, and third dry pumps is arranged such that there is a period of time for which said first and second dry pumps are driven and said third dry pump is stopped, while said substrate cassette is accommodated in said I/O chamber section, and said first and second gate valves are set closed.

6. The method according to claim 1, wherein said step of selectively stopping said first, second, and third dry pumps is arranged such that there is a period of time for which said second dry pump is driven and said first dry pump is stopped, while said substrate cassette is accommodated in said I/O chamber section, said first gate valve is set open, and said second gate valve is set closed.

7. The method according to claim 1, wherein said step of selectively stopping said first, second, and third dry pumps is arranged such that there is a period of time for which said second dry pump is stopped, while said second gate valve is set open, and the substrate is transferred by said transfer unit between said common transfer chamber and said process chamber section.

8. The method according to claim 1, wherein said step of selectively stopping said first, second, and third dry pumps is arranged such that there is a period of time for which said second and third dry pumps are driven and said first dry pump is stopped, while said first and second gate valves are set closed, and the substrate is processed in said process chamber section.

9. The method according to claim 1, wherein said step of selectively stopping said first, second, and third dry pumps is arranged such that there is a period of time for which said second dry pump is driven and said first and third dry pumps are stopped, while said first gate valve is set closed, and a last substrate of said group is transferred from said process chamber section by said transfer unit.

10. The method according to claim 1, wherein said semiconductor process is a process selected from the group consisting of dry etching, CVD film formation, sputtering film formation, vacuum-evaporation film formation, heat-treatment, and resist film removal.

11. The method according to claim 1, wherein said I/O chamber section comprises load and unload chambers.

12. The method according to claim 1, wherein said process chamber section comprises process chambers.

13. The method according to claim 1, wherein said step of selectively stopping said first, second, and third dry pumps is arranged such that said second dry pump is driven and said first dry pump is stopped, while the substrate is transferred by said transfer unit from said I/O chamber section to said common transfer chamber, with said first gate valve set open.

14. The method according to claim 1, wherein said step of selectively stopping said first, second, and third dry pumps is arranged such that said third dry pump is driven and said second dry pump is stopped, while the substrate is transferred by said transfer unit from said common transfer chamber to said process chamber section, with said second gate valve set open.

15. The method according to claim 1, wherein said step of selectively stopping said first, second, and third dry pumps is arranged such that said second dry pump is driven and said third dry pump is stopped, while a last substrate of said group is transferred by said transfer unit from said process chamber section to said common transfer chamber to said process chamber section, with said second gate valve set open.

16. The method according to claim 13, wherein said step of selectively stopping said first, second, and third dry pumps is arranged such that said third dry pump is driven and said second dry pump is stopped, while the substrate is transferred by said transfer unit from said common transfer chamber to said process chamber section, with said second gate valve set open.

17. The method according to claim 16, wherein said step of selectively stopping said first, second, and third dry pumps is arranged such that said second dry pump is driven and said third dry pump is stopped, while a last substrate of said group is transferred by said transfer unit from said process chamber section to said common transfer chamber to said process chamber section, with said second gate valve set open.

18. The method according to claim 1, wherein said step of selectively stopping said first, second, and third dry pumps comprises opening a gate valve between the process chamber section and the common transfer chamber and using one of the second and third dry pumps to exhaust both the process chamber section and the common transfer chamber and stopping the other of the second and third dry pumps.

* * * * *